United States Patent
Kim

(10) Patent No.: US 9,230,869 B2
(45) Date of Patent: Jan. 5, 2016

(54) FLEXIBLE ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventor: Hyun-Joon Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/294,317

(22) Filed: Jun. 3, 2014

(65) Prior Publication Data

US 2015/0235910 A1     Aug. 20, 2015

(30) Foreign Application Priority Data

Feb. 14, 2014     (KR) .......................... 10-2014-0017515

(51) Int. Cl.
| | |
|---|---|
| *H01L 21/02* | (2006.01) |
| *H01L 21/66* | (2006.01) |
| *H01L 27/32* | (2006.01) |

(52) U.S. Cl.
CPC .......... *H01L 22/24* (2013.01); *H01L 21/02675* (2013.01); *H01L 27/3244* (2013.01)

(58) Field of Classification Search
CPC .................. H01L 21/02365; H01L 21/02683; H01L 29/515
See application file for complete search history.

(56) References Cited

U.S. PATENT DOCUMENTS

| | | | |
|---|---|---|---|
| 2006/0087613 | A1 | 4/2006 | Togawa et al. |
| 2009/0113938 | A1 | 5/2009 | Watanabe et al. |
| 2011/0199666 | A1* | 8/2011 | Chun et al. .................... 359/269 |
| 2014/0217383 | A1 | 8/2014 | Park et al. |

FOREIGN PATENT DOCUMENTS

| | | |
|---|---|---|
| JP | 3046493 U | 12/1997 |
| JP | 2006-91672 A | 4/2006 |
| JP | 2008-237965 A | 10/2008 |
| KR | 10-2008-0098016 A | 11/2008 |
| KR | 1020140100853 A | 8/2014 |

* cited by examiner

*Primary Examiner* — Cheung Lee
(74) *Attorney, Agent, or Firm* — Robert E. Bushnell, Esq.

(57) ABSTRACT

A method of manufacturing an organic light-emitting display apparatus, the method including removing a bubble by irradiating a laser in a cross direction to the bubble that occurs in a thin-film transistor.

15 Claims, 6 Drawing Sheets

FLEXIBLE ORGANIC LIGHT-EMITTING DISPLAY APPARATUS AND METHOD OF MANUFACTURING THE SAME

CLAIM OR PRIORITY

This application makes reference to, incorporates the same herein, and claims all benefits accruing under 35 U.S.C. §119 from an application earlier filed in the Korean Intellectual Property Office on 14 Feb. 2014 and there duly assigned Serial No. 10-2014-0017515.

BACKGROUND OF THE INVENTION

1. Field of the Invention

One or more embodiments of the present invention generally relate to a method of manufacturing an organic light-emitting display apparatus.

2. Description of the Related Art

In general, an organic light-emitting display apparatus includes a display unit having a structure in which an emission layer formed of an organic material is interposed between two electrodes, wherein at least one of the two electrodes is connected to a thin-film transistor. When a voltage is applied between the two electrodes via the thin-film transistor, a hole that is injected from one electrode and an electrode that is injected from the other electrode are combined in an emission layer so that an exciton is generated from the combination and emits light and thus an image is realized when the exiton is turned from an exited state to a ground state.

The above information disclosed in this Related Art section is only for enhancement of understanding of the background of the invention and therefore it may contain information that does not form the prior art that is already known to a person of ordinary skill in the art.

SUMMARY OF THE INVENTION

One or more embodiments of the present invention include a method of manufacturing an organic light-emitting display apparatus.

Additional aspects will be set forth in part in the description which follows and, in part, will be apparent from the description, or may be learned by practice of the presented embodiments.

According to one or more embodiments of the present invention, a method of manufacturing an organic light-emitting display apparatus includes operations of forming a display unit including a thin-film transistor on a substrate, and removing a bubble that occurs on the thin-film transistor, by using a laser, wherein, when the bubble is removed, the laser is irradiated to the bubble in a cross direction.

When the laser is irradiated, the laser may be irradiated to the bubble in a first direction crossing the bubble, and then may be irradiated to the bubble in a second direction perpendicular to the first direction.

The first direction may be a direction of a minimum diameter in an area of the bubble, and the laser may be irradiated by a value of the minimum diameter.

The laser may also be irradiated in the second direction by the value of the minimum diameter.

Before the laser is irradiated, the method may further include operations of capturing a location of the bubble by using an image detector, and calculating coordinates to which the laser is irradiated.

The thin-film transistor may include an active layer formed on the substrate; a gate electrode facing the active layer by having a first insulating layer interposed therebetween; and source and drain electrodes that are disposed by having a second insulating layer formed between the gate electrode and the source and drain electrodes, and are connected with the active layer, and the operation of removing the bubble may include an operation of removing the bubble that occurs in the active layer.

A dehydrogenation thermal-treatment process may be performed on the active layer, and the bubble may occur in the active layer while the dehydrogenation thermal-treatment process is performed.

The operation of removing the bubble may further include an operation of removing a bubble that occurs in the second insulating layer.

The bubble may occur in the second insulating layer when a thermal treatment is performed to activate portions of the active layer which are to be connected with the source and drain electrodes.

A shape of the bubble may correspond to at least one of a circular shape, an oval shape, and a double-circle shape.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
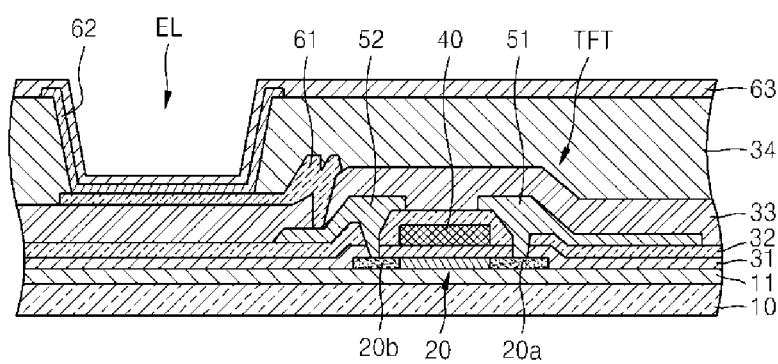
FIG. 1 illustrates a display unit of an organic light-emitting display apparatus according to an embodiment of the present invention.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In the accompanying drawings, those components that are the same or are in correspondence are rendered the same reference numeral regardless of the figure number, and redundant explanations are omitted.

Throughout the specification, a singular form may include plural forms, unless there is a particular description contrary thereto.

Throughout the specification, it will be further understood that the terms "comprises" and/or "comprising" used herein specify the presence of stated features or components, but do not preclude the presence or addition of one or more other features or components.

Throughout the specification, it will be understood that when a layer, region, or component is referred to as being "formed on," another layer, region, or component, it can be directly or indirectly formed on the other layer, region, or component. That is, for example, intervening layers, regions, or components may be present.

In the drawings, for convenience of description, the thicknesses or sizes of elements are exaggerated for clarity, but one or more embodiments of the present invention are not limited thereto. Also, it should also be noted that in some alternative implementations, the steps of all methods described herein may occur out of the order. For example, two steps illustrated in succession may in fact be executed substantially concurrently or the two steps may sometimes be executed in the reverse order.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Expressions such as "at least one of," when preceding a list of elements, modify the entire list of elements and do not modify the individual elements of the list.

FIG. 1 illustrates a display unit of an organic light-emitting display apparatus according to an embodiment of the present invention.

As illustrated in FIG. 1, the display unit of the organic light-emitting display apparatus includes a thin-film transistor TFT, and an organic light emitting device (OLED) EL.

First, the OLED EL emits red, green, or blue light according to a flow of current and thus displays predetermined image information. The OLED EL includes a pixel electrode 61 that is connected to the thin-film transistor TFT, an opposite electrode 63 that is formed to completely cover a pixel, and an emission layer 62 that emits between the pixel electrode 61 and the opposite electrode 63. Thus, when an appropriate voltage is applied between the pixel electrode 61 and the opposite electrode 63, the emission layer 62 emits light so that an image is realized.

Here, a hole injection layer (HIL) (not shown), a hole transport layer (HTL) (not shown), an electron transport layer (ETL) (not shown), an electron injection layer (EIL) (not shown) or the like may be formed above or below the emission layer 62.

The emission layer 62 may be formed at each of pixels so that the pixels that emit red, green, or blue light may be grouped as one unit pixel. Alternatively, an emission layer may be commonly formed while extending over an entire pixel region, regardless of positions of the pixels. Here, the emission layer may have a structure in which layers that include emission materials for emitting red light, green light, and blue light may be vertically stacked or the emission materials may be mixed. A combination of other colors may also be possible, provided that the combination of other colors may emit white light. Also, the emission layer may further include a color conversion layer or a color filter that converts the emitted white light into a predetermined color.

As described above, the thin-film transistor TFT is connected to the pixel electrode 61 of the OLED EL and thus applies a voltage. The thin-film transistor TFT is formed by stacking multiple thin layers on the substrate 10. While the multiple thin layers are stacked, a bubble may occur. Since the bubble causes a problem in a function of the thin-film transistor TFT, the bubbles must be removed. The present embodiment provides a method of effectively removing the bubble by using a laser. The method will be described in detail at a later time, and first, a structure of the thin-film transistor TFT is described as below.

An active layer 20 is formed on a buffer layer 11 on the substrate 10, and has source and drain regions 20a and 20b that are heavily doped with N-type impurity or P-type impurity. The active layer 20 may be selectively formed as an oxide semiconductor. For example, the oxide semiconductor may include an oxide material selected from the group consisting of groups 12, 13, and 14 metal elements including zinc (Zn), indium (In), gallium (Ga), tin (Sn), cadmium (Cd), germanium (Ge), or hafnium (Hf) and a composition thereof. For example, the active layer 20 may be a G-I—Z—O layer $[(In_2O_3)a(Ga_2O_3)b(ZnO)c]$ (where, a, b, c are real numbers that satisfy a≥0, b≥0, c≥0, respectively).

A gate electrode 40 is formed on the active layer 20 by having a first insulating layer 31 interposed therebetween.

A source electrode 51 and a drain electrode 52 are formed on the gate electrode 40, and a second insulating layer 32 is formed between the gate electrode 40 and the source and drain electrodes 51 and 52.

The drain electrode 52 from among the source and drain electrodes 51 and 52 is connected to the pixel electrode 61 of the OLED EL, and a passivation layer 33 is interposed between the source and drain electrodes 51 and 52 and the pixel electrode 61.

A reference numeral 34 indicates a pixel-defining layer. Also, a thin-film encapsulation layer (not shown) may be formed on the opposite electrode 63 by alternately stacking an organic layer and an inorganic layer.

Figure 2A:
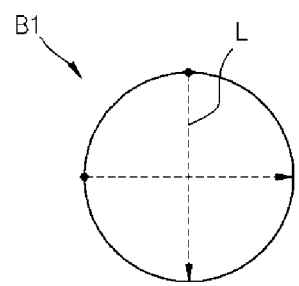
FIGS. 2A through 2C illustrate shapes of a bubble that may occur while a display unit of FIG. 1 is manufactured.
Figure 2B:
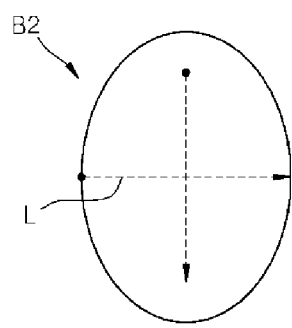
Figure 2C:
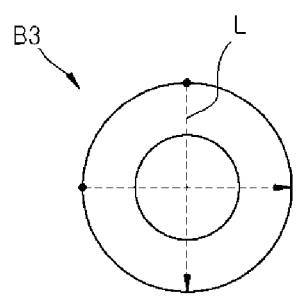

In the aforementioned structure of the thin-film transistor TFT, particularly, in the active layer 20 and the second insulating layer 32, a bubble may easily occur. A bubble mainly occurs when a corresponding layer is heated, and the active layer 20 and the second insulating layer 32 undergo a thermal treatment process during a manufacturing procedure. A shape of the bubble mainly corresponds to one of shapes shown in FIGS. 2A through 2C. That is, a circular bubble B1 as shown in FIG. 2A may occur, an oval bubble B2 as shown in FIG. 2B may occur, or a double-circle bubble B3 as shown in FIG. 2C may occur. In the present embodiment, a laser L is irradiated in a cross manner to each of the bubbles B1, B2, and B3. Then, the swollen bubbles B1, B2, and B3 burst and become flat, and afterward, problems due to the bubbles B1, B2, and B3 do not occur.

In the case of the circular bubble B1 as shown in FIG. 2A, the laser L is irradiated in a direction that crosses a center of the circular bubble B1, and then is irradiated again in a vertical direction perpendicular to the direction, so that circular bubble B1 is removed.

In the case of the oval bubble B2 as shown in FIG. 2B, the laser L is first irradiated along a minimum diameter direction, and then is irradiated in a direction perpendicular to the minimum diameter direction. Here, the laser L is irradiated in the perpendicular direction by a distance of the laser L that is irradiated in the minimum diameter direction. That is, although the laser L is not irradiated in an entire longitudinalaxis direction, if the laser L is irradiated in a cross direction, the oval bubble B2 becomes sufficiently flat.

Also, in the case of the double-circle bubble B3 as shown in FIG. 2C, the laser L is irradiated in horizontal and vertical directions along diameters of an outer circle.

By doing so, the laser L is not irradiated along an exact outer line of each of the bubbles B1, B2, and B3 but is irradiated in a central cross direction according to a minimum diameter of each bubble, so that the bubbles B1, B2, and B3 may be highly effectively and rapidly removed.

A procedure of manufacturing the organic light-emitting display apparatus which includes a process of removing the bubbles B1, B2, and B3 may be performed as below.

Figure 3A:
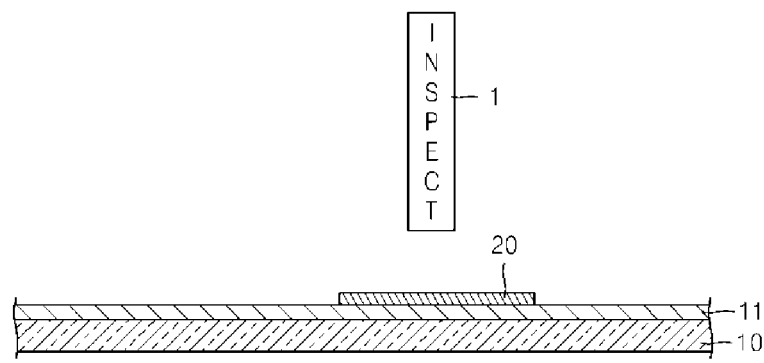
FIGS. 3A through 3H sequentially illustrate processes of manufacturing the display unit of FIG. 1.

First, as illustrated in FIG. 3A, the buffer layer 11 is formed on the substrate 10, and the active layer 20 is formed on the buffer layer 11. Afterward, when a dehydrogenation thermal-treatment process is performed on the active layer 20, the bubbles B1, B2, and B3 having various shapes may occur on the active layer 20. In order to remove the bubbles B1, B2, and B3, an image detector 1 (also, referred as 'inspect 1') as shown in FIG. 3A captures an image of a top portion of the active layer 20 and thus detects existence of the bubbles B1, B2, and B3 and calculates coordinates of the bubbles B1, B2, and B3. The image detector I may be a camera, but not limited to thereto.

Figure 3B:
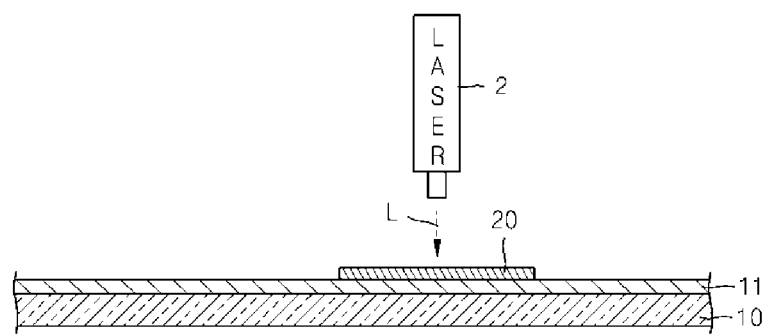
Figure 3C:
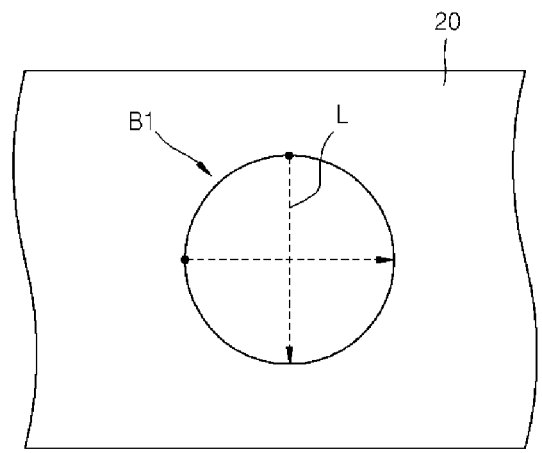

Afterward, as illustrated in FIG. 3B, a laser 2 is sent to the calculated coordinates and then performs a laser irradiation operation. If a detected bubble corresponds to the circular bubble B1, as illustrated in FIG. 3C, a laser L is irradiated in a horizontal direction along a diameter of the circular bubble B1. Then, the laser L is irradiated along the diameter of the circular bubble B1 in a vertical direction perpendicular to the horizontal direction. By doing so, the circular bubble B1 is burst by the laser L that is irradiated in a cross direction, and thus is effectively and rapidly removed.

Here, the dehydrogenation thermal-treatment process is performed while the active layer 20 is not exactly patterned yet but is widely formed on the buffer layer 11, and the removal of the bubbles B1, B2, and B3 is performed after the active layer 20 is patterned as shown in FIG. 3A.

Figure 3D:
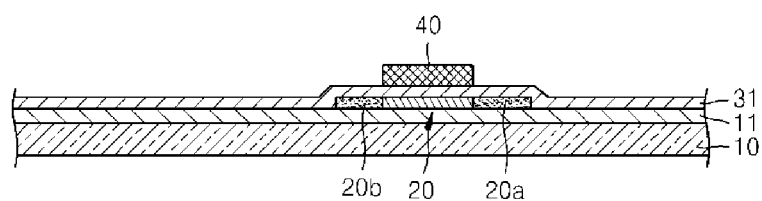

As described above, when the active layer 20 is completely formed and then the bubbles B1, B2, and B3 are removed, as illustrated in FIG. 3D, the first insulating layer 31 and the gate electrode 40 are sequentially formed thereon. Here, the gate electrode 40 faces a central portion of the active layer 20, and in that state, the active layer 20 is doped with N-type impurity or P-type impurity by using the gate electrode 40 as a mask, so that the source and drain regions 20a and 20b are formed in side edges of the active layer 20.

Figure 3E:
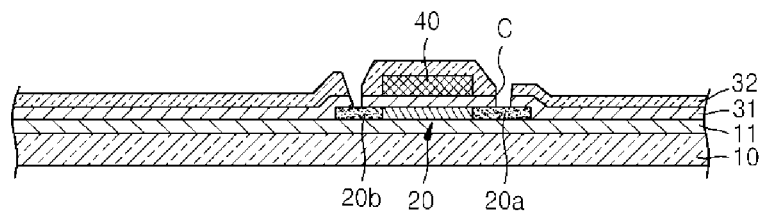
Figure 3F:
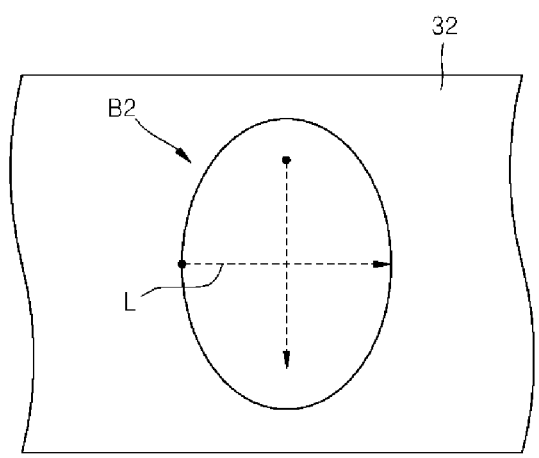

Afterward, as illustrated in FIG. 3E, after the second insulating layer 32 is formed, contact holes C are formed to be connected with the source and drain regions 20a and 20b of the active layer 20. Then, a thermal treatment is performed to activate the source and drain regions 20a and 20b, and here, a bubble may occur in the second insulating layer 32. If the bubble that is detected in the second insulating layer 32 corresponds to the oval bubble B2, as illustrated in FIG. 3F, a laser L is irradiated in a minimum diameter direction of the oval bubble B2. Then, the laser L is irradiated by a minimum diameter in a direction perpendicular to the minimum diameter direction. By doing so, the oval bubble B2 is burst by the laser L that is irradiated in a cross direction, and thus is effectively and rapidly removed.

Figure 3G:
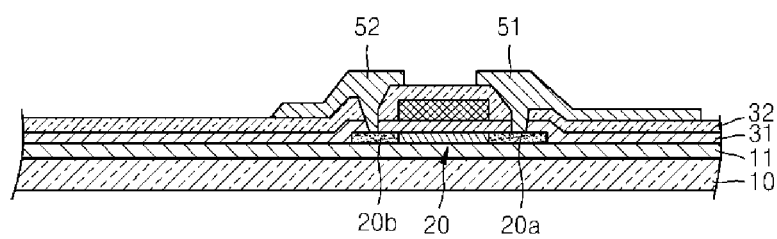

In this manner, when the bubbles of the second insulating layer 32 are removed, as illustrated in FIG. 3G, the source electrode 51 and the drain electrode 52 are formed on the second insulating layer 32, and then are connected with the source and drain regions 20a and 20b of the active layer 20 via the contact holes C.

Figure 3H:
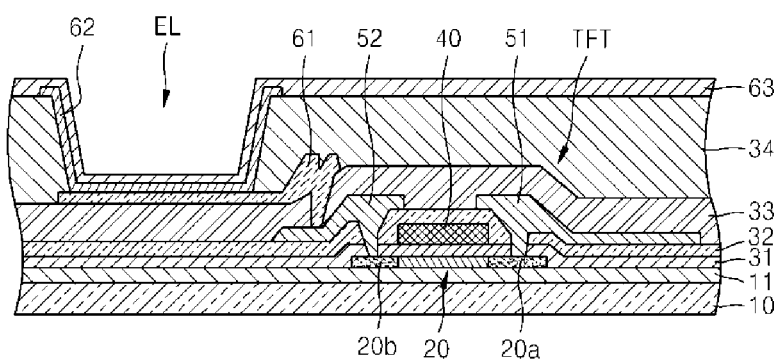

Afterward, when the OLED EL including the pixel electrode 61, the emission layer 62, and the opposite electrode 63 is formed, the display unit as shown in FIG. 3H is manufactured.

In the aforementioned manufacturing procedure, it is assumed that the circular bubble B1 and the oval bubble B2 occur. However, in the case where the double-circle bubble B3 as shown in FIG. 2C occurs, if the laser L is irradiated in a cross direction along the diameter of the outer circle, the double-circle bubble B3 may be effectively and rapidly removed. In other words, the laser L is irradiated in horizontal and vertical directions along diameters of an outer circle of the double-circle bubble.

According to the method of manufacturing the organic light-emitting display apparatus in the present embodiment, bubbles that are internally formed during the manufacturing procedure may be effectively removed, so that a lifetime and reliability of a product may be significantly improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
   forming a display unit comprising a thin-film transistor on a substrate; and
   removing a bubble that occurs on the thin-film transistor by using a laser, and when the bubble is removed, the laser is irradiated to the bubble in a cross direction;
   when the laser is irradiated, the laser is irradiated to the bubble in a first direction crossing the bubble, and then is irradiated to the bubble in a second direction perpendicular to the first direction.

2. The method of claim 1, the first direction being a direction of a minimum diameter in an area of the bubble, and
   the laser being irradiated by a value of the minimum diameter.

3. The method of claim 2, the laser being also irradiated in the second direction by the value of the minimum diameter.

4. The method of claim 1, further comprising, before the laser is irradiated,
   capturing a location of the bubble by using an image detector, and
   calculating coordinates to which the laser is irradiated.

5. The method of claim 1, the thin-film transistor comprising an active layer formed on the substrate;
   a gate electrode facing the active layer by having a first insulating layer interposed therebetween; and
   source and drain electrodes disposed by having a second insulating layer formed between the gate electrode and the source and drain electrodes, and connected with the active layer, and
   the removing of the bubble comprising removing the bubble that occurs in the active layer.

6. The method of claim 5, a dehydrogenation thermal-treatment process being performed on the active layer, and
the bubble occurs in the active layer while the dehydrogenation thermal-treatment process is performed.

7. The method of claim 5, the removing of the bubble further comprising removing a bubble that occurs in the second insulating layer.

8. The method of claim 7, the bubble occurs in the second insulating layer when a thermal treatment is performed to activate portions of the active layer which are to be connected with the source and drain electrodes.

9. The method of claim 1, a shape of the bubble corresponding to at least one of a circular shape, an oval shape, and a double-circle shape.

10. A method of manufacturing an organic light-emitting display apparatus having a display unit with a thin-film transistor disposed on a substrate, the method comprising:
    capturing an image of the thin-film transistor using an image detector;
    detecting the presence of a bubble in the thin-film transistor using the captured image;
    calculating coordinates of an outer surface of the bubble using the captured image;
    determining the shape of the bubble as being either circular, oval or a double-circle;
    irradiating the bubble in a first direction using a laser; and
    irradiating the bubble in a second direction that is perpendicular to the first direction using the laser, when the shape of the bubble is circular or the double-circle, the first direction of the laser is through a center of the bubble and when the shape of the bubble is oval, the first direction of the bubble is at point of minimum diameter of the bubble.

11. The method of claim 10, the thin-film transistor comprising:
    an active layer formed on the substrate;
    a gate electrode facing the active layer having a first insulating layer interposed between the gate electrode and the active layer; and
    source and drain electrodes disposed by having a second insulating layer formed between the gate electrode and the source and drain electrodes, and connected with the active layer, and
    the removing of the bubble comprising removing the bubble that occurs in the active layer.

12. The method of claim 11, a dehydrogenation thermal-treatment process being performed on the active layer, and
the bubble occurs in the active layer while the dehydrogenation thermal-treatment process is performed.

13. The method of claim 11, the removing of the bubble further comprising removing a bubble that occurs in the second insulating layer.

14. The method of claim 13, the bubble occurs in the second insulating layer when a thermal treatment is performed to activate portions of the active layer which are to be connected with the source and drain electrodes.

15. The method of claim 10, when the bubble is determined to be the double-circle bubble, the first direction of the laser being through the center of an outer circle of the double-circle bubble.

* * * * *